(12) United States Patent
Kim et al.

(10) Patent No.: US 7,589,022 B2
(45) Date of Patent: Sep. 15, 2009

(54) METHOD OF CHEMICAL MECHANICAL POLISHING AND METHOD OF FABRICATING SEMICONDUCTOR DEVICE USING THE SAME

(75) Inventors: Hyun-Suk Kim, Gyeonggi-do (KR); Won-Jin Kim, Gyeonggi-do (KR); Joon-Hee Lee, Gyeonggi-do (KR); Yong-Seok Kim, Gyeonggi-do (KR); Jong-Won Kim, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 64 days.

(21) Appl. No.: 11/585,713

(22) Filed: Oct. 24, 2006

(65) Prior Publication Data

US 2007/0093063 A1    Apr. 26, 2007

(30) Foreign Application Priority Data

Oct. 24, 2005    (KR) ............... 10-2005-0100410

(51) Int. Cl.
*H01L 21/461* (2006.01)
(52) U.S. Cl. .................. 438/691; 257/E21.214
(58) Field of Classification Search ............... 438/692, 438/691; 257/E21.214
See application file for complete search history.

(56) References Cited

U.S. PATENT DOCUMENTS 6,001,708 A * 12/1999 Liu et al. ............... 438/435
6,048,771 A * 4/2000 Lin et al. ............... 438/296
6,169,028 B1 * 1/2001 Wang et al. ............. 438/653
6,232,200 B1   5/2001 Chu
6,492,260 B1 * 12/2002 Kim et al. ............... 438/631
6,774,452 B1   8/2004 Ramkumar et al.
7,029,591 B2 * 4/2006 Catabay et al. ........... 216/38
2005/0282389 A1 * 12/2005 Kawasaki ............... 438/692
2006/0292795 A1 * 12/2006 Kwon et al. ............. 438/257

FOREIGN PATENT DOCUMENTS

| KR | 10-1998-0063426 | 7/1998 |
| KR | 10-2001-0107562 | 12/2001 |
| KR | 1020020043908 A | 6/2002 |
| KR | 1020050035361 A | 4/2005 |

* cited by examiner

*Primary Examiner*—W. David Coleman
(74) *Attorney, Agent, or Firm*—Myers Bigel Sibley & Sajovec, P.A.

(57) ABSTRACT

There is provided a method of chemical mechanical polishing (CMP) and a method of fabricating a semiconductor device using the same. The method includes forming a layer to be polished on a semiconductor substrate including a normally polished region and a dished region, and forming a dishing (i.e., over-polishing)-preventing layer on the layer to be polished in the region where dishing may occur. Then, the layer to be polished is polished while dishing thereof is prevented using the dishing-preventing layer. Accordingly, the dishing-preventing layer is formed in the region where the dishing (i.e., over-polishing) may occur, so that the dishing is prevented from occurring in a region where pattern density is low and a pattern size is large in the process of CMP.

11 Claims, 9 Drawing Sheets

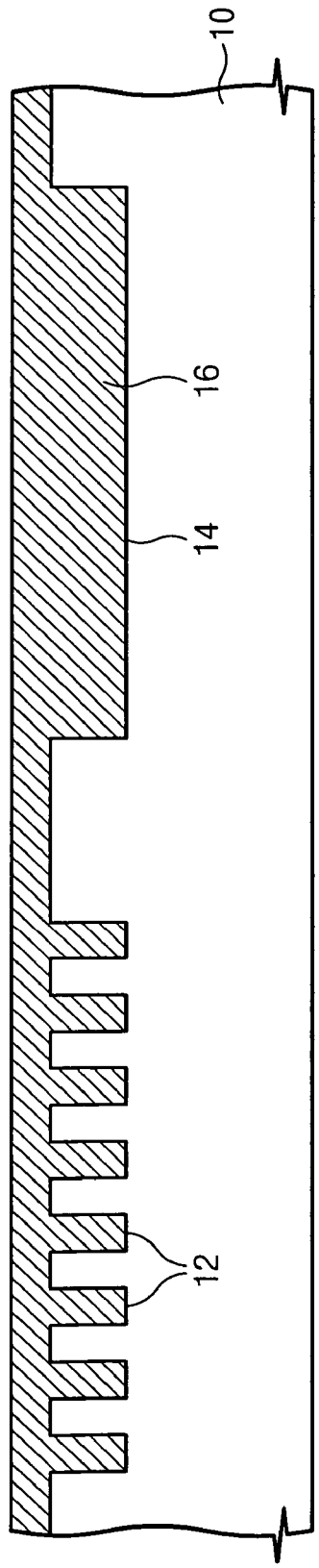
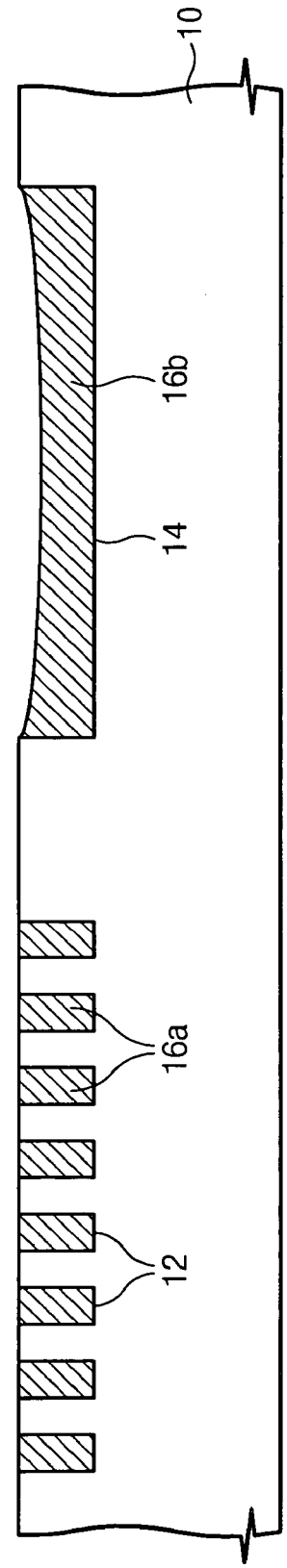
Fig. 1 (PRIOR ART)
Fig. 2 (PRIOR ART)

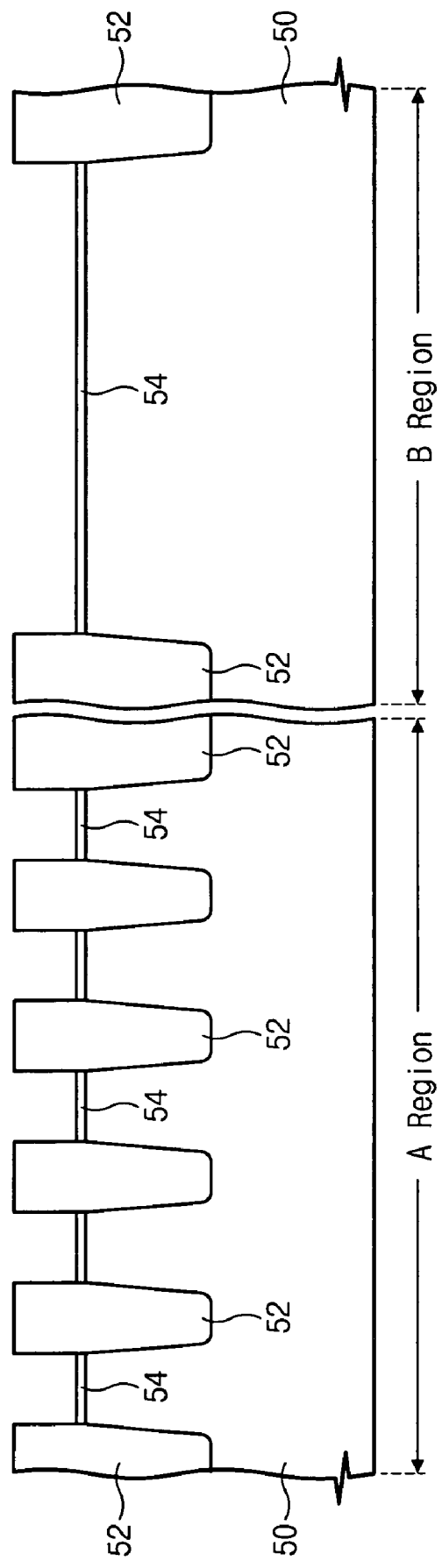

METHOD OF CHEMICAL MECHANICAL POLISHING AND METHOD OF FABRICATING SEMICONDUCTOR DEVICE USING THE SAME

RELATED APPLICATION

This application is related to and claims priority from Korean Patent Application No. 2005-0100410 filed on Oct. 24, 2005, in the Korean Intellectual Property Office, the disclosure of which is hereby incorporated herein by reference as if set forth in its entirety.

FIELD OF THE INVENTION

The present invention relates generally to semiconductor devices, and more particularly, to methods of fabricating semiconductor devices.

BACKGROUND OF THE INVENTION

Chemical mechanical polishing (CMP) used to fabricate a semiconductor device is a technology that forms a planarized layer on a semiconductor device by polishing a target layer formed on the substrate, or that forms patterns by a damascene technique using different polishing rates of two or more materials.

In a CMP process, a suitable slurry for a material to be polished is supplied to polish a layer to be polished. A polishing aspect varies depending on an area occupied by the layer to be polished and on pattern density in a region where a layer to be polished remains.

As illustrated in FIG. 1, a semiconductor substrate includes thereon first patterns 12 formed at high density, each with small widths, and a second pattern 14 formed at low density with a layer width. The CMP process may be performed on such a semiconductor substrate to form the resulting patterns filling the first patterns 12 and the second pattern 14 with their top surfaces planarized. In order to form the resulting patterns, a layer 16 to be polished is formed on the semiconductor substrate having the first patterns 12 and the second pattern 14.

As illustrated in FIG. 2, the layer 16 to be polished is polished using a slurry that polishes it more quickly than the semiconductor substrate 10 is polished, to thereby form third patterns 16a and a fourth pattern 16b respectively filled in the first patterns 12 and the second pattern 14. Considering the purpose of the CMP process, top surfaces of the third patterns 16a and the fourth pattern 16b should be planarized and aligned with a top surface of the semiconductor substrate 10. However, as illustrated, the layer to be polished is over-polished in a region where pattern density of the resulting patterns is high or the pattern area is large. This causes dishing in the top surface of the fourth pattern 16b which causes the top surface to be lower than other regions, as illustrated.

Referring to FIG. 3, in subsequent processes, when portions of the third patterns 16a and the fourth pattern 16b are removed to expose the substrate 10, the substrate 18 under the fourth pattern 16b may become over-etched and damaged due to the dishing in the region where the pattern density is low or the pattern area is large. On the other hand, when the third patterns 16a and the fourth pattern 16b are etched until the substrate 18 under the fourth pattern 16b is exposed, the third patterns 16a may not become completely etched, and thus the substrate thereunder may not be exposed.

For example, when a large region is a monitoring pattern that monitors a process on a small device region, the dishing of the large monitoring pattern may interfere with an accurate determination of a process result in the small device region. Also, when both large and small regions are included within the device region, the process results of both regions may differ from each other, which may cause a material in any one of the regions to remain or become over-etched.

SUMMARY OF THE INVENTION

Embodiments of the present invention provide a method of chemical mechanical polishing (CMP) capable of preventing dishing (over-polishing) of a layer to be polished by forming a dishing-preventing layer on the layer to be polished in a region where the dishing is expected to occur. The method includes forming a layer to be polished on a semiconductor substrate including a normally polished region and a dished (over-polished) region; and forming a dishing-preventing layer on the layer to be polished in the region where the dishing may occur. Then, the layer to be polished is polished while dishing is prevented by the dishing-preventing layer.

In some embodiments, an additional layer to be polished is formed on an entire surface of a substrate having the dishing-preventing layer, and the additional layer to be polished and the layer to be polished are polished to thereby obtain a resulting material. The dishing-preventing layer does not expose the layer to be polished in the region where the dishing may occur so that it prevents the layer to be polished from being polished after the additional layer to be polished is polished.

In other embodiments of the present invention, the dishing-preventing layer is preferably formed in a region where pattern density of the resulting material formed of the layer to be polished is low or its exposed area is large because the dishing of the layer to be polished occur in such a region where the pattern density of the resulting material formed by polishing the layer to be polished or its exposed area is large.

In further embodiments, the dishing-preventing layer is formed of a material being polished more slowly than the layer to be polished. The dishing-preventing layer may remain on the layer to be polished after the layer to be polished is polished at a desired thickness, or may be completely removed while preventing the polishing of the layer to be polished in the region where the dishing may occur. The remaining dishing-preventing layer is removed after the polishing process is completed.

In other embodiments, according to the method of CMP of the present invention, the dishing (the over-etching) of the layer to be polished is prevented, so that patterns with uniform thickness may be formed without being affected by the pattern density. Also, a process may be more accurately monitored with a process monitoring pattern that is greater in size than a pattern formed in a device region and used to indirectly determine the process state of the device region.

In yet other embodiments of the present invention, a method of fabricating a semiconductor substrate using a method of CMP capable of preventing dishing (over-polishing) of a layer to be polished is provided. The method includes forming device isolation layers on a substrate to define first active regions, each with a small area, and a second active region with a large area; forming a gate insulating layer on the active regions; and forming a gate conductive layer on an entire surface of the substrate having the gate insulating layer. A dishing-preventing layer is formed on the gate conductive layer in the second active region. The dishing-preventing layer is formed of a material that is polished more slowly than the gate conductive layer. First conductive layer patterns and a second conductive layer pattern are formed in the first active regions and the second active region, respectively, by polishing the gate conductive layer while preventing dishing using the dishing-preventing layer. Here, the first and second conductive layer patterns are aligned with the device isolation layers.

In further embodiments of the present invention, forming an additional gate conductive layer on an entire surface of the substrate having the dishing-preventing layer may be further included. The additional gate conductive layer and the gate conductive layer are polished while the dishing-preventing layer prevents dishing from occurring. The additional gate conductive layer and the gate conductive layer are polished until the device isolation layers are exposed, so that first conductive layer patterns and the second conductive pattern aligned with the device isolation layers are formed in the first active regions and the second active region, respectively.

In other embodiments of the present invention, the first conductive layer patterns may be patterns for forming first gate patterns at high pattern density, and the second conductive layer pattern may be a pattern for forming a second gate pattern at low pattern density or may be a monitoring pattern for monitoring a process of forming the first gate patterns.

In further embodiments of the present invention, for example, the first conductive layer. patterns and the second conductive layer pattern may be patterned in a gate-pattern forming operation to thereby form first gate patterns and a second gate pattern. In yet further embodiments of the present invention, the first conductive layer patterns may be patterned in a gate-pattern forming operation to thereby form first gate patterns, and the second conductive layer pattern may be patterned in the gate-pattern forming operation together with parts of the first conductive layer patterns. By measuring a thickness of an oxide layer on the substrate in a region where the second conductive layer patterns have been removed, a thickness of an oxide layer under the first conductive layer pattern removed to form the first gate pattern may be indirectly monitored.

In other embodiments of the present invention, a decrease in thickness of the second conductive layer pattern due to dishing (over-polishing) is prevented, so that the oxide layer in a region where the first conductive layer patterns have been removed may have almost the same thickness as that of the oxide layer in the region where the second conductive layer pattern has been removed. Because the dishing-preventing layer prevents the polishing of the layer to be polished, the second conductive layer pattern is almost the same as an initial thickness of the layer to be polished. Even though the thickness of the layer to be polished varies in each region, the thicknesses of the first conductive layer patterns and the second conductive layer pattern after completion of polishing are predictable. Accordingly, even though the thicknesses of the first conductive layer patterns and the second conductive layer pattern are different, the thickness of the oxide layer in the region where the first conductive layer patterns have been removed can be monitored in consideration of the thickness difference.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings:

FIGS. 1 to 3 are cross-sectional views of a semiconductor substrate that illustrate problems of conventional chemical mechanical polishing (CMP); and FIGS. 4 to 11 are cross-sectional views of a semiconductor substrate that illustrate CMP according to embodiments of the present invention.

DETAILED DESCRIPTION OF EMBODIMENTS OF THE INVENTION

Figure 3:
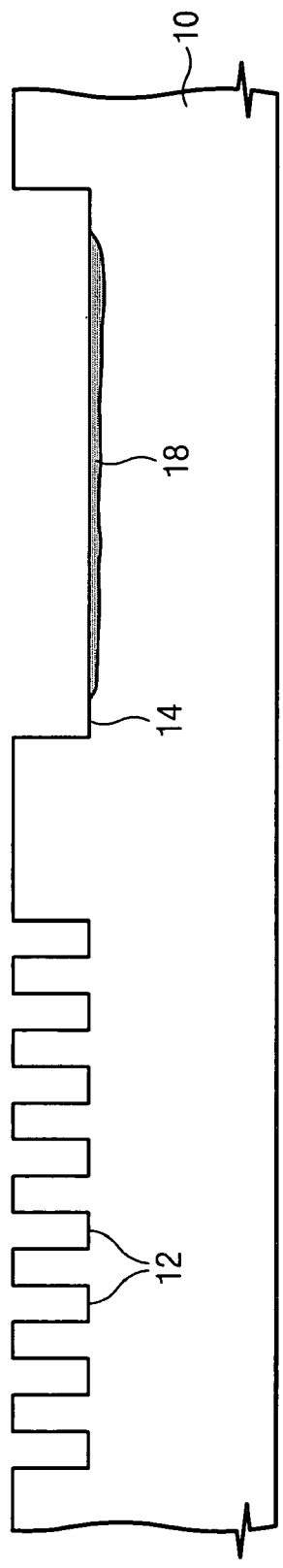

Reference will now be made in detail to the preferred embodiments of the present invention, examples of which are illustrated in the accompanying drawings. However, the present invention is not limited to the embodiments illustrated hereinafter, and the embodiments herein are rather introduced to provide easy and complete understanding of the scope and spirit of the present invention. It will also be understood that when a layer is referred to as being "on" another layer or substrate, it can be directly on the other layer or substrate, or intervening layers may also be present. Like reference numerals in the drawings denote like elements.

FIGS. 4 to 11 are cross-sectional views of a semiconductor substrate that illustrate a method of forming a floating gate pattern of a flash memory, according to embodiments of the present invention.

Figure 4:
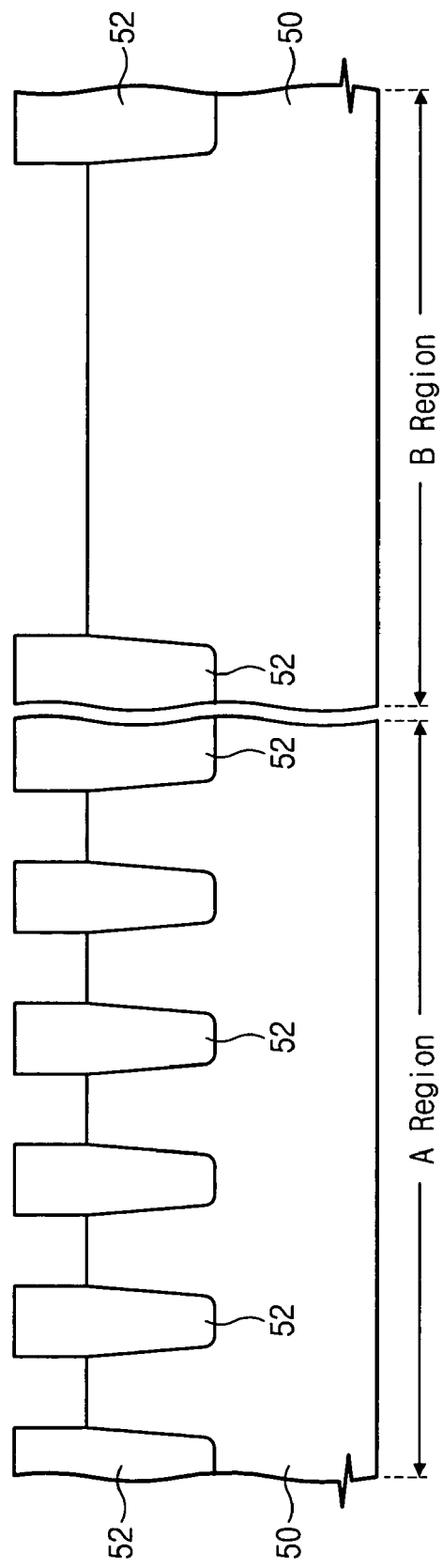

Referring to FIG. 4, a plurality of active regions are defined by forming device isolation layers 52 in a semiconductor substrate 50. The semiconductor substrate 50 may be divided into a cell array region (region A) having a plurality of active regions formed at high density, each with small areas, and a peripheral circuit region and a monitoring pattern region (region B) having an active region formed at low density with a large area.

In a self-aligned device isolation structure, a floating gate pattern is formed with its sidewalls aligned with the device isolation layers. In order to form the self-aligned device isolation structure, the device isolation layers 52 protrude from the semiconductor substrate.

Figure 5:
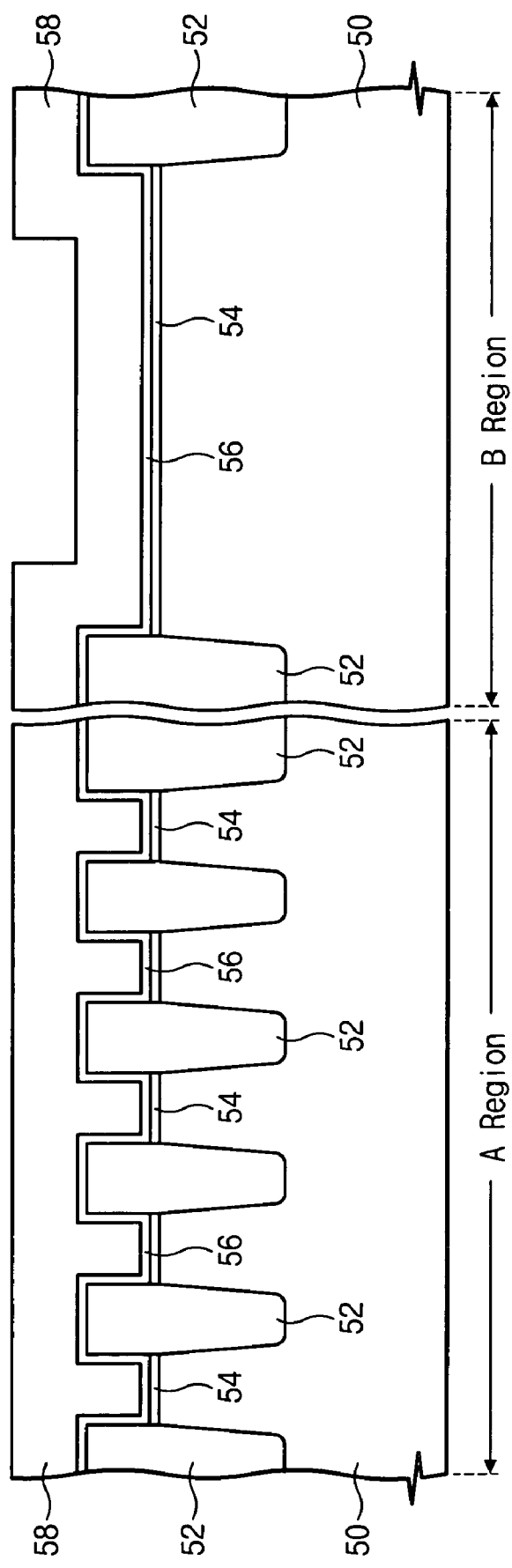

Referring to FIG. 5, a gate insulating layer 54 is formed on the active regions. Here, a gate insulating layer 54 of the cell array region (region A) in which pattern density is high is a tunnel insulating layer where tunneling of electrons occurs. Also, a gate insulating layer 54 thicker than the tunnel insulating layer may be formed in the peripheral region and the monitoring pattern region (region B) in which pattern density is low. If the region B is a monitoring pattern region, a gate insulating layer having the same thickness as the tunnel insulating layer may be formed therein so as to monitor a process result of the cell array region.

A gate conductive layer is formed up to the height of the device isolation layers 52 on an entire surface of the semiconductor substrate having the gate insulating layer 54. Each of the device isolation layers 52 may have slanted sidewalls due to the upward-increasing width of its protruding portion from the substrate. In this case, it is not preferable to form just one thick gate conductive layer because such a gate conductive layer may not reach edge portions of the active region the device isolation layers are covering. Therefore, the gate conductive layer may include a first gate conductive layer 56 and a second gate conductive layer 58, as illustrated. The first gate conductive layer 56 is formed by forming a conductive layer on an entire surface of the substrate having the gate insulating layer 54 and then removing portions of the conductive layer by a method such as an etch-back method or the like, so that the first gate conductive layer 56 reaches the active regions that the slanted portions of the device isolation layers 52 cover. Then, the second gate conductive layer 58 with a sufficient thickness is formed up to the height of the device isolation layers 52. Because the gate conductive layer is formed along curves of the lower substrate, it is preferable to form the gate conductive layer up to the height of the device isolation layers in a large active region.

Figure 6:
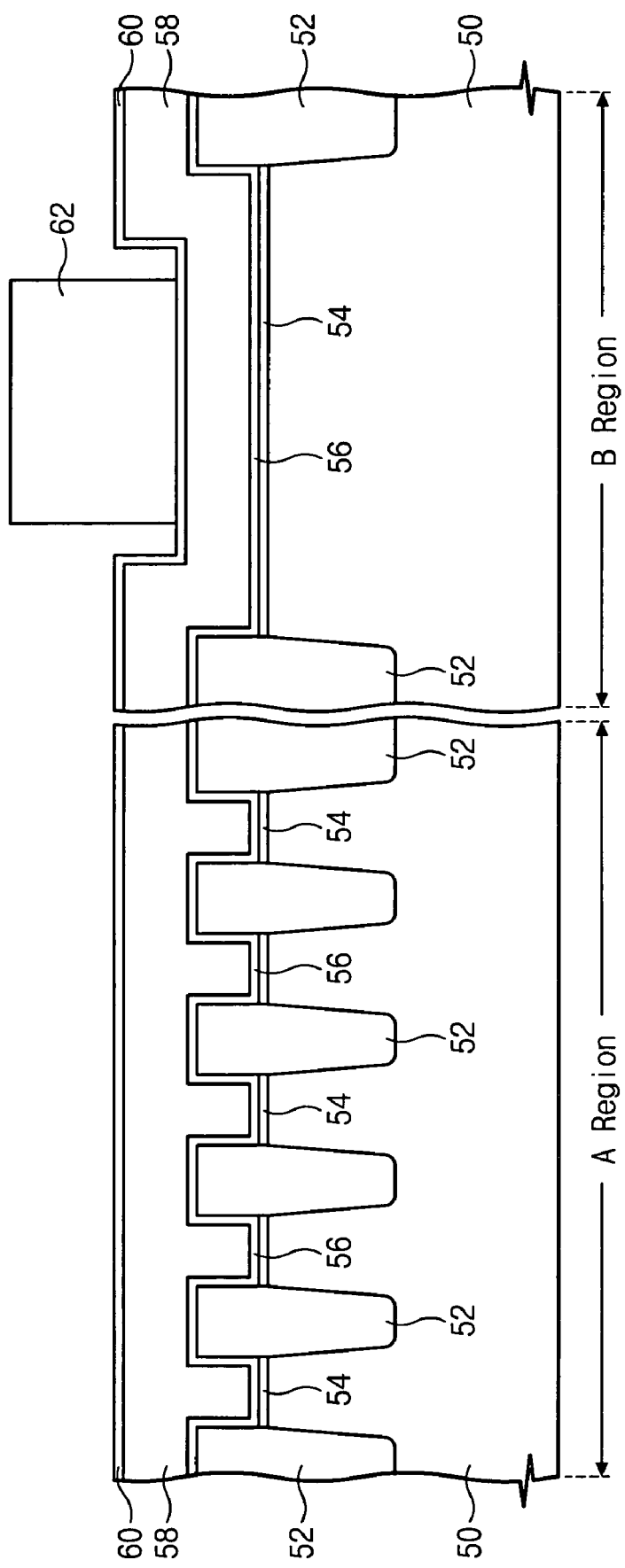

Referring to FIG. 6, an insulating layer 60 that is configured to polish more slowly than the gate conductive layer is formed on an entire surface of the substrate having the gate conductive layer, and a photoresist pattern 62 is formed on the insulating layer 60. The photoresist pattern 62 is formed to cover a portion of the gate conductive layer which may be over-polished(i.e., dished). For example, the photoresist pattern 62 may be formed in a large active region and a region where the density of active regions is low. The first gate conductive layer 56 and the second gate conductive layer 58 may be formed of polysilicon. In this case, in the CMP process, a slurry that polishes polysilicon at a high rate (i.e., quickly), and an insulating layer 60 such as a silicon nitride layer that is polished by the slurry at a low rate (i.e., slowly) may be formed on the polysilicon.

Figure 7:
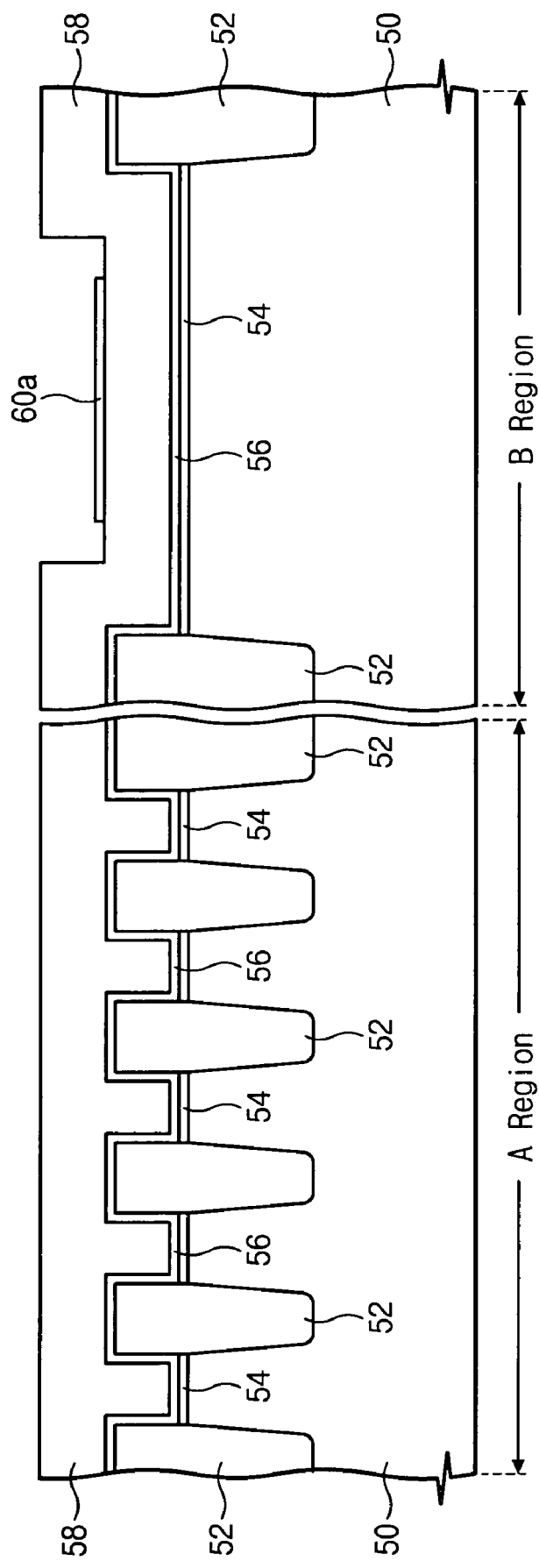

Referring to FIG. 7, the insulating layer 60 is patterned using the photoresist pattern 62 as an etching mask, and the photoresist pattern 62 is removed. Thus, a dishing (i.e., over-polishing)-preventing layer 60a is formed on a region that may be dished, for example, a large active region and a region where the formation density of the active region is low.

Figure 8:
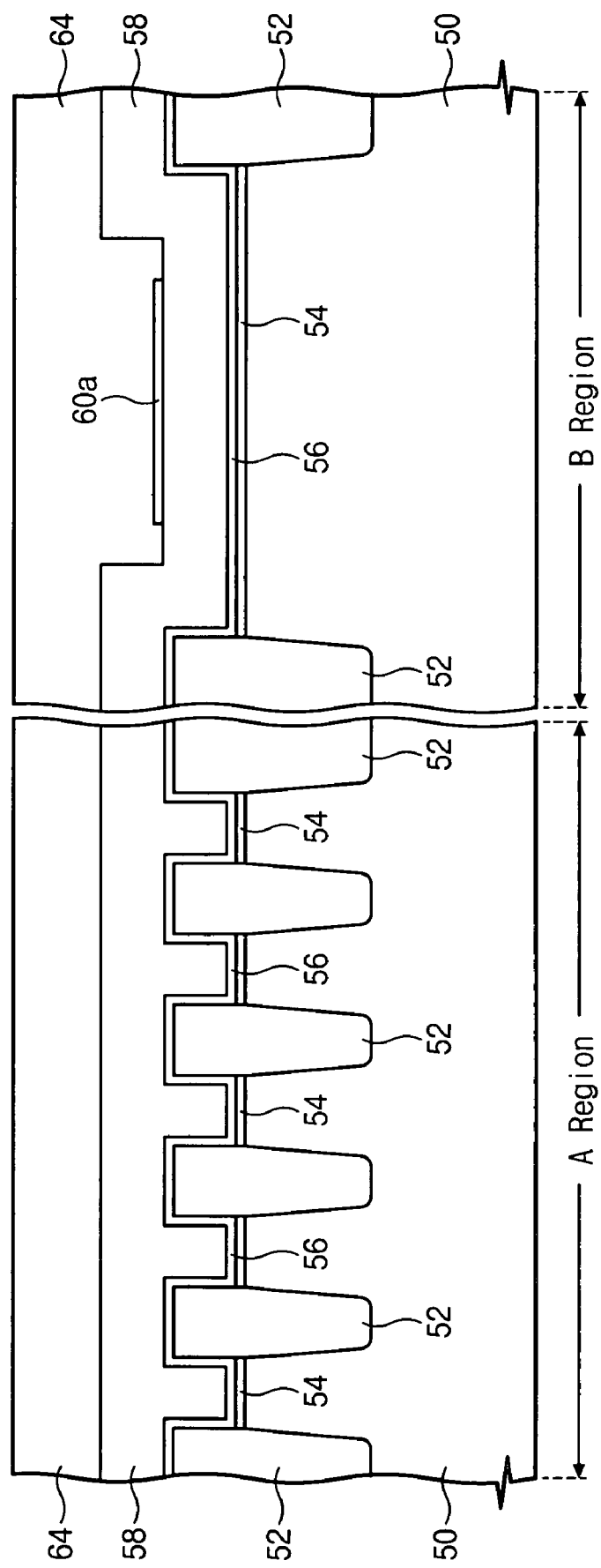

Referring to FIG. 8, an additional gate conductive layer 64 is formed on an entire surface of the substrate having the dishing-preventing layer 60a. The additional gate conductive layer 64 serves to reduce curves of the gate conductive layer. The additional gate conductive layer 64 may or may not be formed.

Figure 9:
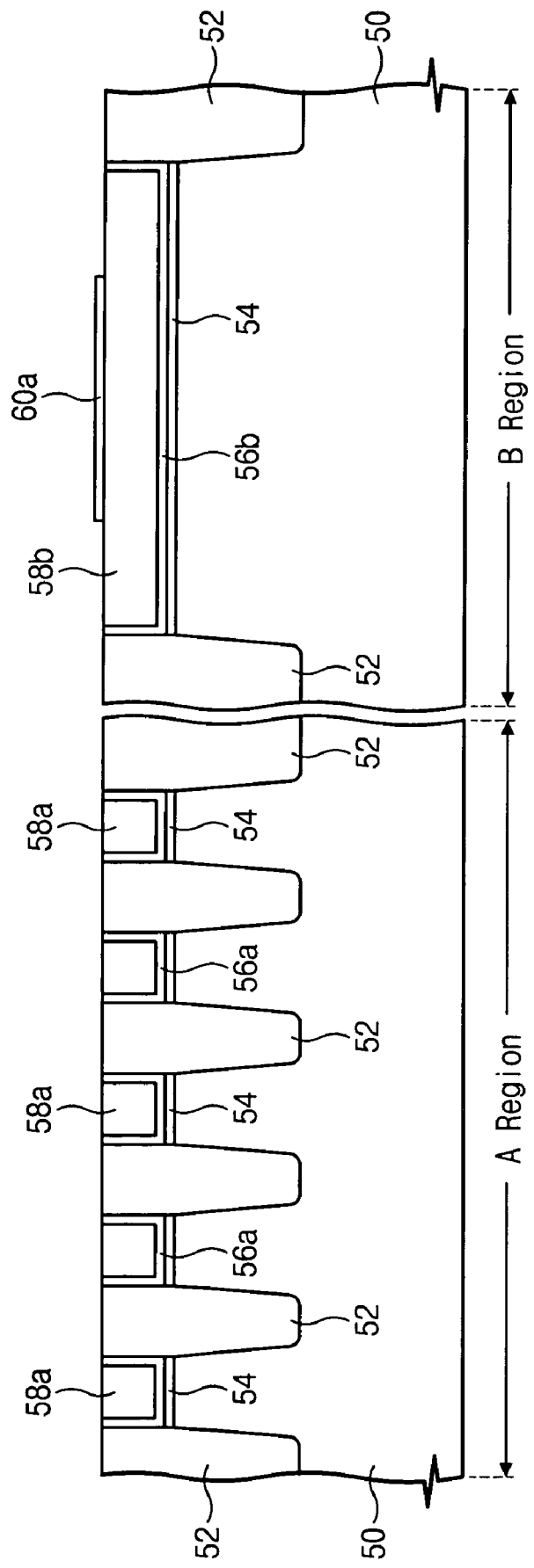

Referring to FIG. 9, the additional gate conductive layer 64 and the first and second gate conductive layers 56 and 58 are polished to expose the device isolation layers 52, thereby forming first conductive layer patterns 58a and a second conductive layer pattern 58b. Here, because the dishing-preventing layer 60 is formed on the second gate conductive layer 58 in a region that may be dished, the gate conductive layer thereunder can be prevented from being polished and thus from being dished. If the second conductive layer pattern 58b is a pattern for monitoring a process, the thickness of the second conductive layer 58 under the dishing-preventing layer 60a may be previously measured before the polishing operation.

Figure 10:
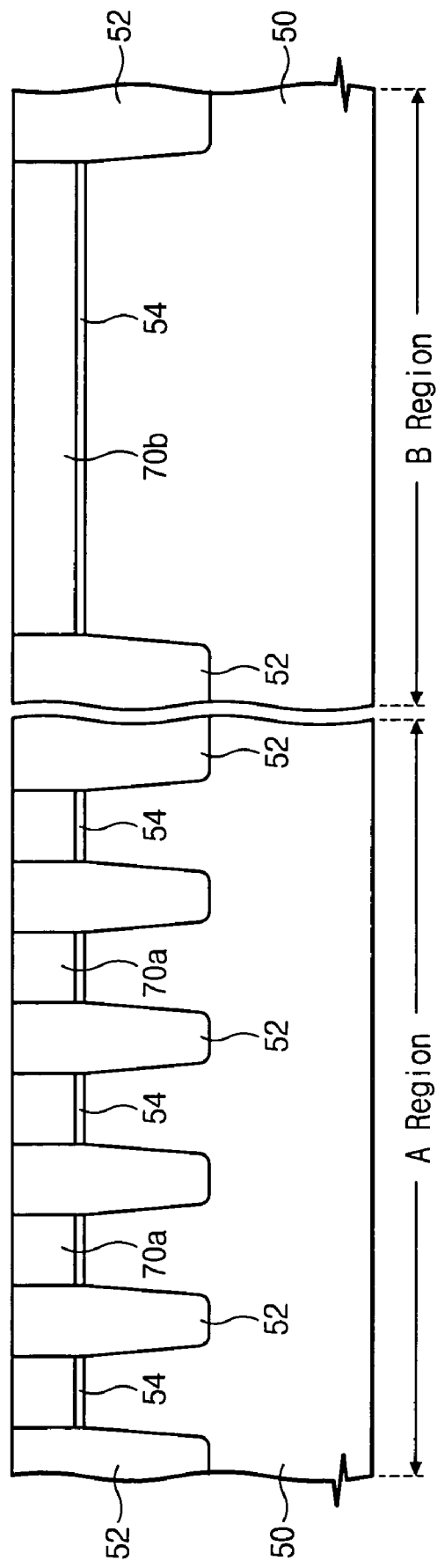

Referring to FIG. 10, the remaining dishing-preventing layer 60a is removed. Consequently, floating gate patterns 70a each including the first gate conductive layer 56 and the second gate conductive layer 58 are formed in the cell array region (region A) where pattern density is high. Also, a gate pattern or a monitoring pattern 70b including the first gate conductive layer and the second gate conductive layer is formed in the peripheral circuit region and the monitoring region (region B) where pattern density is low and pattern area is large.

Referring to FIG. 11, the floating gate patterns 70a are patterned using common fabrication processes including forming and patterning an inter-gate insulating layer and a control gate conductive layer, to thereby form floating gates (not shown). Here, the gate pattern of the peripheral circuit region is patterned to thereby form a peripheral circuit gate pattern (not shown), and a monitoring pattern of the monitoring region is also removed. Because the gate pattern or the monitoring pattern 70b has almost the same thickness as the floating gate pattern 70a, over-etching or insufficient etching due to the difference in thickness therebetween does not occur. Also, the second active region 14 from which the monitoring pattern has been removed is in almost the same condition as the first active region 12 under the floating gate pattern 70a etched to form the floating gate. Therefore, examining the substrate of the monitoring region may provide indirect monitoring of the state of the substrate of the device region.

As described so far, according to embodiments of the present invention, a dishing-preventing layer is formed in a region where dishing may occur, so that the likelihood of dishing occurring may be reduced in a region where a large pattern is formed or pattern density is low.

According to embodiments of the present invention, dishing may be prevented or reduced in a monitoring pattern which is large and formation density which is low as compared to a cell array, so that the process state of the cell array region may be more accurately monitored with the monitoring pattern during the process of removing a pattern formed by the CMP process.

Also, according to embodiments of the present invention, because patterns having almost the same thickness may be formed in the cell array region and the peripheral circuit region having different pattern density, defective operations such as insufficient etching in the cell array region or over-etching in the peripheral circuit region may be prevented from occurring in the following gate forming process.

It will be apparent to those skilled in the art that various modifications and variations can be made in the present invention. Thus, it is intended that the present invention covers the modifications and variations of this invention provided they come within the scope of the appended claims and their equivalents.

What is claimed is:

1. A method of CMP (chemical mechanical polishing), the method comprising:
   forming a layer on a semiconductor substrate including a normally polished region;
   forming a planar dishing-preventing layer on the layer in a region where dishing may occur;
   forming an additional layer on a surface of the substrate having the dishing-preventing layer;
   polishing the additional layer and the layer; and
   removing the dishing-preventing layer after the layer is polished.

2. The method of claim 1, wherein the dishing-preventing layer is formed of a material that polishes more slowly than the layer.

3. The method of claim 1, wherein, after polishing of the layer, the semiconductor substrate includes a first region where a pattern density is high and a second region where a pattern density is low.

4. The method of claim 3, wherein a pattern formed by the layer in the first region has a small exposed area, and wherein a pattern formed by the layer in the second region has a large exposed area.

5. A method of fabricating a semiconductor device, the method comprising:
   forming device isolation layers on a substrate to define first active regions each having a small area, and a second active region with a large area;
   forming a gate insulating layer on the active regions;
   forming a gate conductive layer on a surface of the substrate having the gate insulating layer;
   forming a dishing-preventing layer on the gate conductive layer in the second active region;
   forming first conductive layer patterns and a second conductive layer pattern in the first active regions and the second active region, respectively, by polishing the gate conductive layer, wherein the first and second conductive layer patterns are aligned with the device isolation layers;

forming an additional gate conductive layer on a surface of the substrate having the dishing-preventing layer, wherein the additional gate conductive layer and the gate conductive layer are polished so that first conductive layer patterns and the second conductive pattern aligned with the device isolation layers are formed in the first active regions and the second active region, respectively; and removing the dishing-preventing layer remaining in the second active region after polishing the gate conductive layer.

6. The method of claim 5, further comprising forming gate patterns by patterning the first conductive layer patterns and removing the second conductive layer pattern at the same time.

7. The method of claim 5, wherein first gate patterns and a second gate pattern are respectively formed on the first active regions and the second active region by patterning the first conductive layer patterns and the second conductive layer pattern.

8. The method of claim 5, wherein pattern density of the first active regions is higher than pattern density of the second active region.

9. The method of claim 5, wherein the dishing-preventing layer is formed of a material that polishes more slowly than the gate conductive layer.

10. The method of claim 6, wherein the second conductive layer pattern is removed, and a thickness of the gate conductive insulating layer in the second active region is measured to monitor damage to the first active regions due to patterning of the first conductive layer patterns.

11. The method of claim 9, wherein the dishing-preventing layer is formed of a silicon nitride layer.

* * * * *